United States Patent [19]
Kohno

[11] Patent Number: 5,357,212
[45] Date of Patent: Oct. 18, 1994

[54] MICROWAVE AMPLIFIER

[75] Inventor: Masaki Kohno, Itami, Japan

[73] Assignee: Mitsubishi Denki Kabushiki Kaisha, Tokyo, Japan

[21] Appl. No.: 97,906

[22] Filed: Jul. 28, 1993

[30] Foreign Application Priority Data

Jul. 30, 1992 [JP] Japan .................. 4-203408

[51] Int. Cl.$^5$ .............................. H03F 3/60
[52] U.S. Cl. .................. 330/277; 330/286
[58] Field of Search .............. 330/277, 286, 53

[56] References Cited

FOREIGN PATENT DOCUMENTS 101648 8/1979 Japan .................. 330/286
64-49401 2/1989 Japan .

OTHER PUBLICATIONS

"Characterization of Discontinuities-II", Computer-Aided Design, pp. 189-199, Artech House, 1981.
Koster et al., "The Microstrip Step Discontinuity: A Revised Description", IEEE Transactions on Microwave Theory and Techniques, vol. MTT-34, No. 2, 1986, pp. 213-223, Feb. 1986.

*Primary Examiner*—James B. Mullins
*Attorney, Agent, or Firm*—Leydig, Voit & Mayer

[57] ABSTRACT

A microwave amplifier includes input-side and output-side matching circuits disposed on the input side and output side of a microwave FET. Each of the matching circuits is a distributed constant circuit including microstrip lines disposed on a substrate of dielectric material. The input-side matching circuit includes a connecting section for connection to the FET. The connecting section comprises a first microstrip line having a first width equal to that of the input-side matching circuit, and a second microstrip line continuous and integral with the first microstrip line and having a second width smaller than the first width. The connecting section connects the input-side matching circuit to the input of the FET.

23 Claims, 6 Drawing Sheets

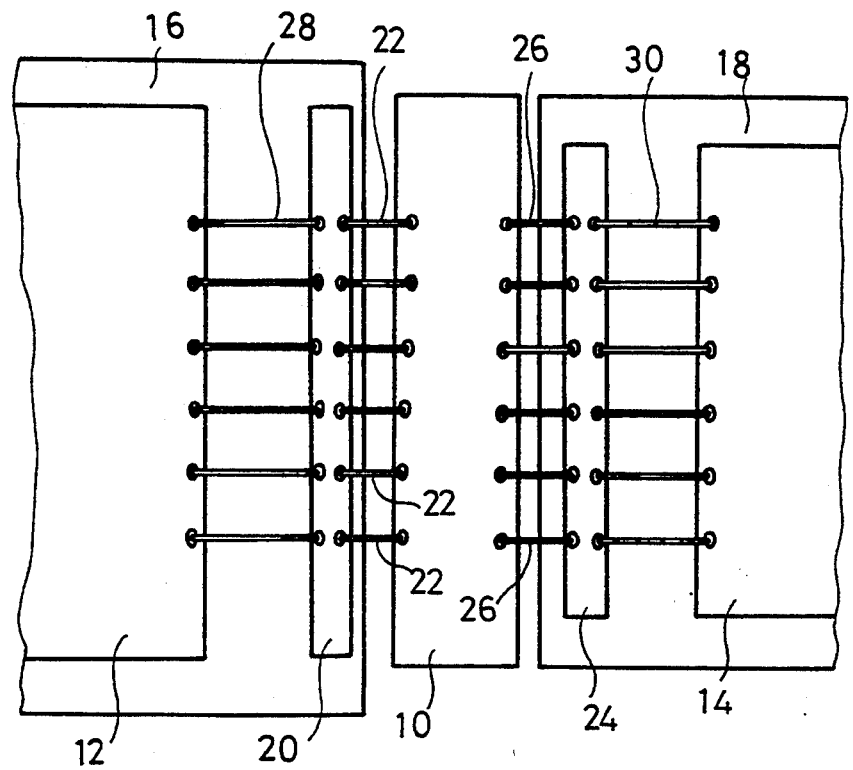
FIG. 1 PRIOR ART
FIG. 2(a)
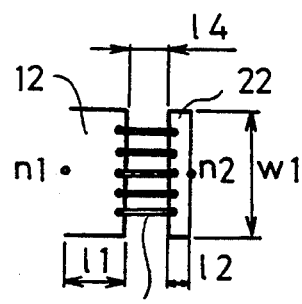
FIG. 2(b)
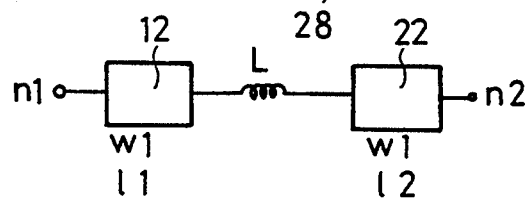

MICROWAVE AMPLIFIER

The invention relates to a microwave amplifier, and, in particular, to a microwave amplifier including matching circuits in input and output sides of a microwave amplifying device.

BACKGROUND OF THE INVENTION

Some conventional microwave amplifiers of the above-described type employ a GaAs FET as a microwave amplifying device thereof. Some of such GaAs FET's have an input reflection S parameter S11 and an output reflection S parameter S22 which are both capacitive. When an amplifier is a common-source amplifier, in order to adjust input and output impedances of such an FET to a predetermined value, e.g. 50 Ω, an inductor may have to be formed in series with the gate of the FET or a long strip line may have to be connected to the gate, and, similarly, in the output side, too, an inductor should be formed in series with the drain, or a long strip line should be connected to the drain. This causes the imaginary parts of the input and output reflection S parameters S11 and S22 to be zero.

FIG. 1 shows an example in which inductors are connected in series with a gate and a drain of a FET. A microwave amplifier shown in FIG. 1 includes a GaAs FET 10, an input-side matching circuit 12, and an output-side matching circuit 14. Input-side and output-side matching circuits 12 and 14 are disposed on dielectric substrates 16 and 18, respectively. A metallic pattern 20 for connection is disposed on substrate 16 at a location close to FET 10. The gate of FET 10 is connected to metallic pattern 20 via bonding wires 22. Similarly, a metallic pattern 24 for connection is disposed on dielectric substrate 18 at a location close to FET 10. The drain of FET 10 is connected by bonding wires 26 to metallic pattern 24.

FET 10 and dielectric substrates 16 and 18 are housed in a metallic casing (not shown), with the source of FET 10 connected to the metallic casing.

A plurality of bonding wires 28 connect metallic pattern 20 and input-side matching circuit 12, and, similarly, a plurality of bonding wires 30 connect metallic pattern 24 to output-side matching circuit 14. Bonding wires 28 function as an inductor L shown in an equivalent circuit of FIG. 2(b). Bonding wires 30 also function as inductor L. Thus, in this configuration, an inductor is connected in series with the gate and with the drain.

FIG. 3 shows a microwave amplifier which includes bonding wires as inductors as in the case of FIGS. 1 and 2, and which also includes four GaAs FET's 32 having a total gate width of 18.9 mm and a unit gate width of 150 μm. FIG. 3 shows input-side matching circuits and FET's 32 and their vicinity in an equivalent circuit which has resulted from simulating the microwave amplifier in which a signal in a range of from 2.6 GHz to 3.7 GHz is applied to four FET's 32 through a distributor (not shown) and respective input-side matching circuits for amplification, and amplified outputs from respective FET's 32 are derived through respective output-side matching circuits (not shown) and combined with each other in a combinet (not shown). The simulation has been made to minimize input and output return loss.

Input reflection S parameter S11 of each FET 32 is −0.312 dB and at −175.6°, therefore, is capacitive at the center frequency of 3.2 GHz. In order to translate this S parameter S11 to an S parameter (−0.312 dB, 180°) having only a real part by disposing an inductor in series with the gate of FET 32, the inductor must have a value of about 0.2 nH. In the conventional circuit shown in FIG. 3, this value is provided by an inductor 34 of 0.1 nH and an inductor 36 of 0.095 nH.

After that, impedance conversion is provided by a ¼ wavelength distributed constant line 42 to provide matching with 50 Ω. Although not shown, similar inductors are used in the output-side matching circuits to thereby cancel the imaginary part of the parameter S22 of FET 32, and, then, a ¼ wavelength distributed constant line is used for impedance conversion to 50 Ω.

FIG. 4 is an implementation of pact of the equivalent circuit shown in FIG. 3. The circuit is disposed on a dielectric substrate 38 having a relative dielectric constant of 91 and having a thickness of 0.15 mm. A pattern 40 to be connected to the gate of an FET 32, a ¼ wavelength distributed constant line (input-side matching circuit) 42, a pattern 44 for connecting pattern 40 to line 42 are also disposed on dielectric substrate 38.

The gate of FET 32 and pattern 40 are interconnected by bonding wires 46. Patterns 40 and 44 are interconnected by bonding wires 34a which are arranged to provide a total inductance of 0.1 nH. Pattern 44 and input-side matching circuit 42 are interconnected by bonding wires 36a which are arranged to provide a total inductance of 0.095 nH.

When there are differences in the characteristics of FETs 32, the imaginary part of parameter S11 cannot be cancelled by inductors of 0.1 nH and 0.095 nH, the numbers of bonding wires 34a and 36a may be changed to adjust the inductance to desired inductance. In the example shown in FIG. 4, the length of dielectric substrate 38, l, is about 3 mm.

The arrangement shown in FIG. 4 employs a number of bonding wires. It is troublesome to bond these wires to necessary parts of the circuit. This reduces manufacturing efficiency. Furthermore, for connecting bonding wires 34a and 36a, spacing must be disposed between connecting patterns 40 and 44 and between pattern 44 and matching circuit 42, which undesirably necessitates the use of a relatively large dielectric substrate.

In addition, in the arrangement of FIG. 4, when inductors of 0.1 nH and 0.095 nH cannot move S11 onto the real part axis of Smith chart due to variation in the performance of FETs 32, the inductance is adjusted by changing the number of bonding wires changing the number of bonding wires results in stepwise change of inductance so that only rough adjustment can be made.

SUMMARY OF THE INVENTION

A microwave amplifier according to the present invention includes a microwave amplifying device, an input-side matching circuit connected to the input side of the microwave amplifying device, and an output-side matching circuit connected to the output side of the microwave amplifying device. Each of the matching circuits is a distributed constant circuit compressing microstrip lines disposed on a dielectric substrate. At least one of the matching circuits includes a portion for connection to the amplifying device, which connecting portion includes a first microstrip line having a first width equal to the width dimension of its associated matching circuit and a second microstrip line continuous to the first microstrip line having a width smaller than the first width. Each of the first and second microstrip lines may comprise a plurality of microstrip lines.

According to a second feature of the present invention, a plurality of metallic islands which may be additionally used as part of the second microstrip line may be disposed on at least one side of the second microstrip line.

BRIEF DESCRIPTION OF THE DRAWINGS

FIG. 1 is a plan view of a part in the vicinity of an FET in an example of conventional microwave amplifiers;

FIG. 2a shows microstrip lines 12 and 20 and bonding wires of the microwave amplifier of FIG. 1, and FIG. 2b shows an equivalent circuit of the portion shown in FIG. 2a;

FIG. 6b is an equivalent circuit of the arrangement shown in FIG. 6a;

DESCRIPTION OF PREFERRED EMBODIMENTS

Figure 5:
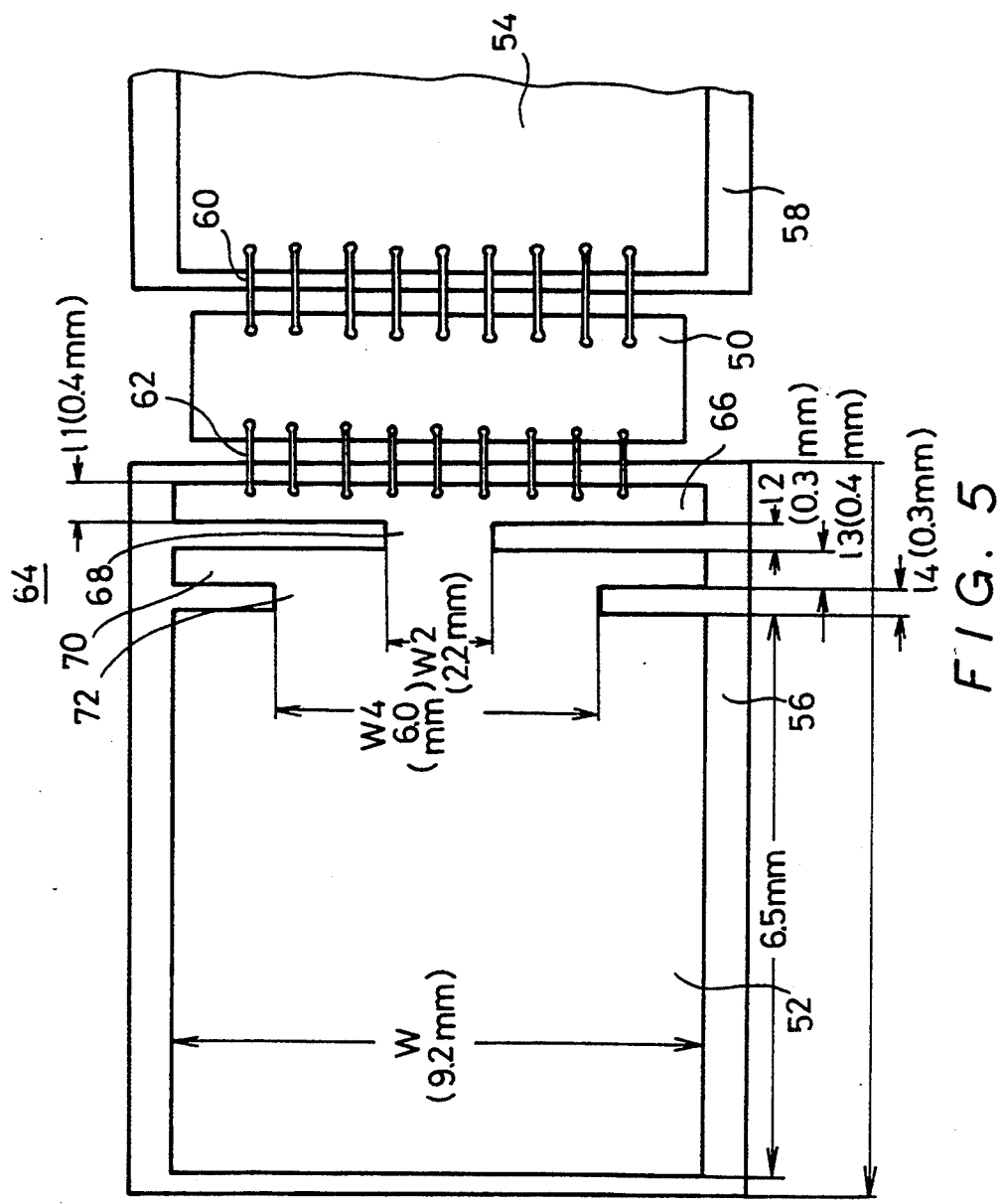
FIG. 5 is a plane view of a microwave amplifier according to one embodiment of the present invention in the vicinity of a FET.

As shown in FIG. 5, a microwave amplifier according to a first embodiment of the present invention comprises a microwave FET 50, an input-side matching circuit 52, and an output-side matching circuit 54. Input-side matching circuit 52 is disposed on a dielectric substrate 56, and output-side matching circuit 54 is disposed on a dielectric substrate 58. Although not shown, a metallic container houses FET 50 and substrates 56 and 58. Thus, because matching circuits 52 and 54 face the bottom of the metallic container with dielectric substrates 56 and 58 interposed therebetween, they function as microstrip lines. In other words, matching circuits 52 and 54 are distributed constant type matching circuits.

FET 50 has a source, a drain and a gate, with the source connected to the metallic container. The drain is connected to output-side matching circuit 54 by bonding wires 60, and the gate is connected to input-side matching circuit 52 by bonding wires 62 and a connecting section generally designated by a reference numeral 64.

Connecting section 64 comprises microstrip lines 66, 68, 70 and 72. Microstrip line 66 is connected to the gate of FET 50 by bonding wires 62. One end of microstrip line 68 is connected to the center portion of microstrip line 66, and the other end is connected to one end of microstrip line 70. The other end of microstrip line 70 is connected to one end of microstrip line 72 having its other end connected, in turn, to input-side matching circuit 52.

Each of microstrip lines 66 and 70 has a width W equal to that of input-side matching circuit 52, while microstrip lines 68 and 72 have widths N2 and N4, respectively, which are smaller than that of input-side matching circuit 52. The width W2 of microstrip line 68 is greater than the width W4 of microstrip line 72.

Figure 6A:
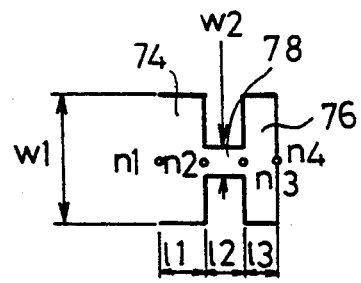
FIG. 6a shows a basic configuration of a microstrip line which is used in the first embodiment.
Figure 6B:
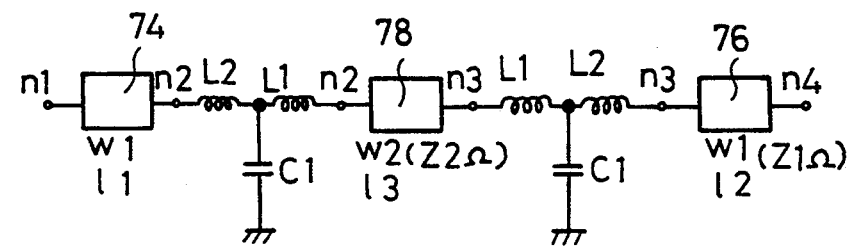

As shown in FIG. 6a, when two microstrip lines 74 and 76 having the same width W1 are interconnected by a microstrip line 78 having a smaller width N2, its equivalent circuit is as shown in FIG. 6b. In this equivalent circuit, inductors L1 and L2 are connected in series between microstrip lines 74 and 78, and a capacitor C1 is connected between the junction of two inductors L1 and L2 and ground. Similarly, inductors L1 and L2 and a capacitor C1 are formed between microstrip lines 78 and 76.

In FIG. 6b, Z1 represents the impedance of microstrip lines 74 and 76, and Z2 represents the impedance of microstrip line 78. These impedances are determined by the widths of microstrip lines 74, 76 and 78, their thicknesses, the dielectric constants of dielectric substrates on which microstrip lines 74, 76 and 78 are disposed, and the thicknesses of the substrates.

The value of C1 may be derived by the following expression (1) or (2), where $\epsilon r$ is the relative dielectric constant of the dielectric substrates.

$$\frac{C1}{\sqrt{W1 \cdot W2}} (pF/m) = (4.386\ln\epsilon r + 2.33)\frac{W2}{W1} - \quad (1)$$

$$5.472\ln\epsilon r - 3.17$$

for $\epsilon r \leq 10$, and $1.5 \leq W2/W1 \leq 3.5$.

$$\frac{C1}{\sqrt{W1 \cdot W2}} (pF/m) = 56.46\ln\left(\frac{W2}{W1}\right) - 44 \quad (2)$$

for $\epsilon r = 9.6$, and $3.5 \leq W2/W1 \leq 10$.

Similarly, the values of L1 and L2 can be calculated according to the following expressions (3) and (4).

$$L1 = Ls \cdot LW1/(LW1 + LW2) \quad (3)$$

$$L2 = Ls \cdot LW2/(LW1 + LW2) \quad (4)$$

In these expressions, $LW1 = Z1\sqrt{\epsilon r1}/C$ and $LW2 = Z1\sqrt{\epsilon r1}/C$, where C is the speed of light ($3 \times 10^8$ m/s), and $\sqrt{\epsilon r1}$ is a wavelength reduction factor of a microstrip line.

The value of Ls can be derived by an expression (5).

$$\frac{Ls}{h}(nH/m) = 40.5\left(\frac{W2}{W1} - 1.0\right) - 32.57\ln\frac{W2}{W1} + \quad (5)$$

$$0.2\left(\frac{W2}{W1} - 1\right)^2$$

In the expression (5), h is the thickness of a dielectric substrate.

As is understood from the above, serially connected inductors can be formed between two microstrip lines of the same width by connecting them through a narrower microstrip line between them. Thus, by disposing microstrip lines 66, 68, 70 and 72 as shown in FIG. 5, an inductor can be disposed between input-side matching circuit 52 and the gate of FET 50. The inductance of this inductor can be adjusted by adjusting the widths of microstrip lines 66, 68, 70 and 72 so as to cancel the imaginary part of the input reflection parameter S11 of FET 50 which is capacitive.

FIG. 5 shows the length and width dimensions of microstrip lines 66, 68, 70 and 72 and input-side matching circuit 52 for one GaAs FET 50 of a microwave amplifier according to the present invention which employs four such FET's 50 having a total gate width of 18.9 mm with a unit gate width being 150 μm and receiving an input signal of from 2.6 to 3.8 GHz distributed thereto through a common distributor (not shown) and respective four input-side matching circuits 52. The amplified outputs from the four FET's are applied through respective output-side matching circuits 54 to a common combiner (not shown) for combining. Although not shown in FIG. 5, the width dimension of microstrip lines 66 arid 70 is equal to that of input-side matching circuit 52. These length and width dimensions are for an arrangement which employs as dielectric substrate 56, a dielectric substrate having a relative dielectric constant of 10 and a thickness of 0.22 mm. With the width dimensions of microstrip lines 66 and 70 being equal to the width dimension W of input-side matching circuit 52, a desired value of the inductance of the inductor between input-side matching circuit S2 and the gate of FET 50 can be established by appropriately choosing the widths W2 and W4 of microstrip lines 68 and 72, respectively. Because the length of any of microstrip lines 66, 68, 70 and 72 does not affect the inductance of the inductor, these microstrip lines can be made short.

Figure 3:
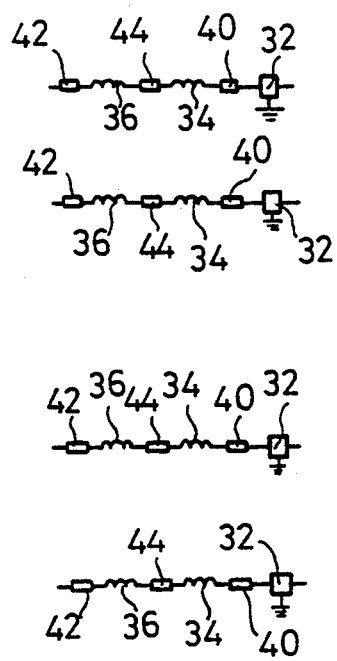
FIG. 3 shows equivalent circuits of portions near each of four FET's used in a conventional microwave amplifier.
Figure 4:
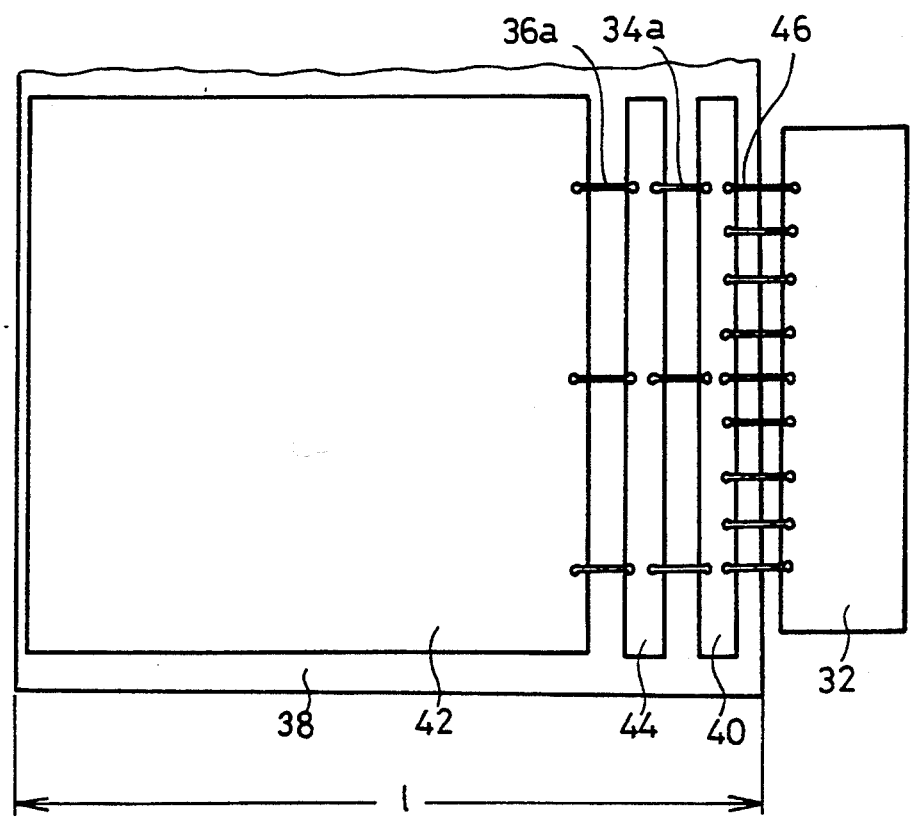
FIG. 4 is a plan view of the microwave amplifier of FIG. 3 in the vicinity of one FET thereof.
Figure 7:
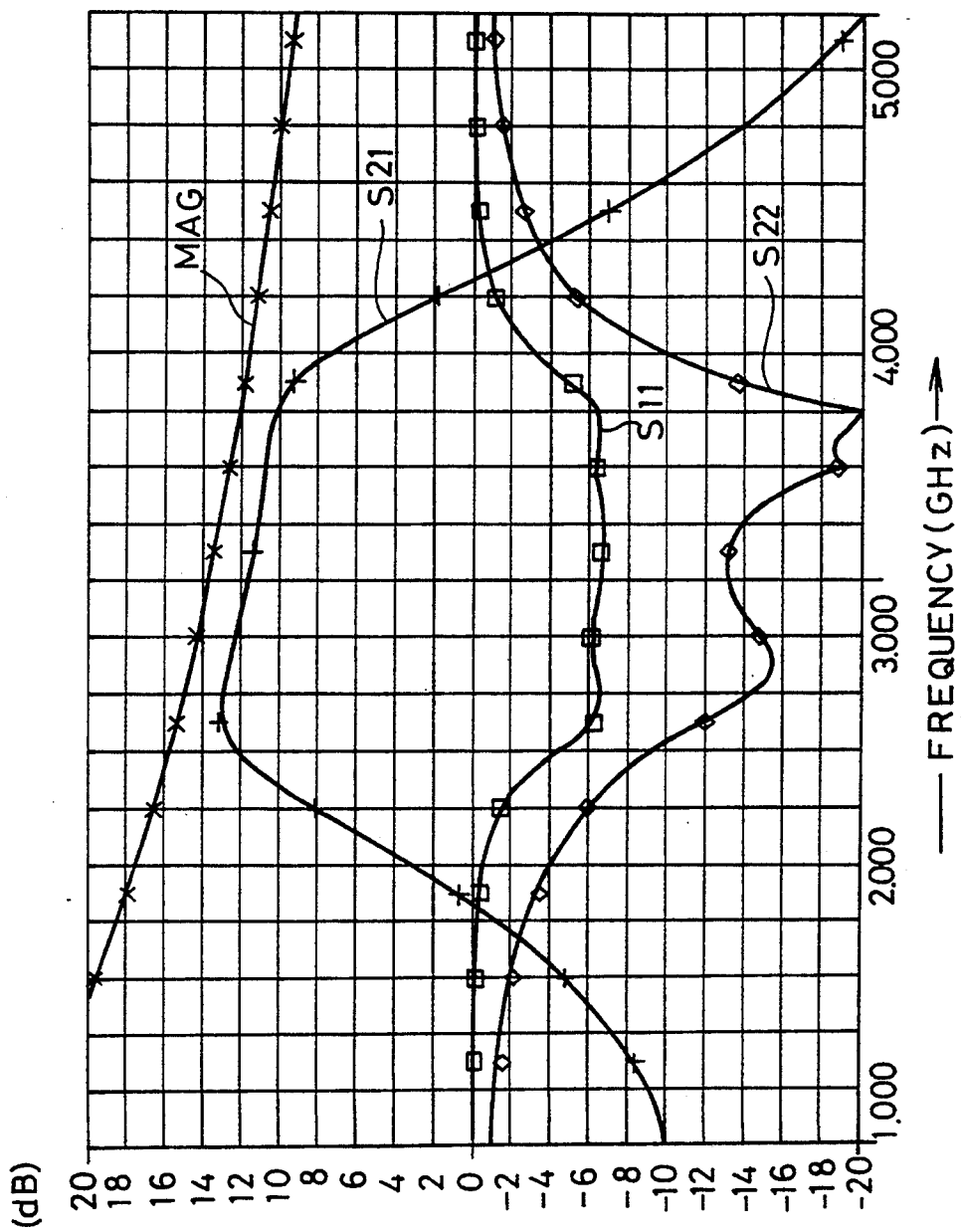
FIG. 7 shows S-parameter characteristics of the first embodiment.

FIG. 7 shows S parameters S11, S21 and S22 and a maximum available power gain MAG of FET 50, which are derived by simulating operation of the microwave amplifier shown in FIG. 5. The gain S21 is more than 10 dB at frequencies between 2.3 GHz and 3.6 GHz, the input return loss is less than −6 dB at frequencies of from 2.45 to 3.6 GHz, and the output return loss S22 is less than −10 dB at a frequency of from 2.45 to 3.65 GHz. These results are similar to those obtained for the conventional amplifier shown in FIG. 4. When a substrate having a relative dielectric constant of 91 and a thickness of 0.15 mm as used in the conventional amplifier shown in FIG. 4 was used as dielectric substrate 56 in the amplifier of FIG. 5, the length of dielectric substrate 56 was about 2.7 mm which was shorter by about 10% than that in the conventional amplifier.

Figure 8:
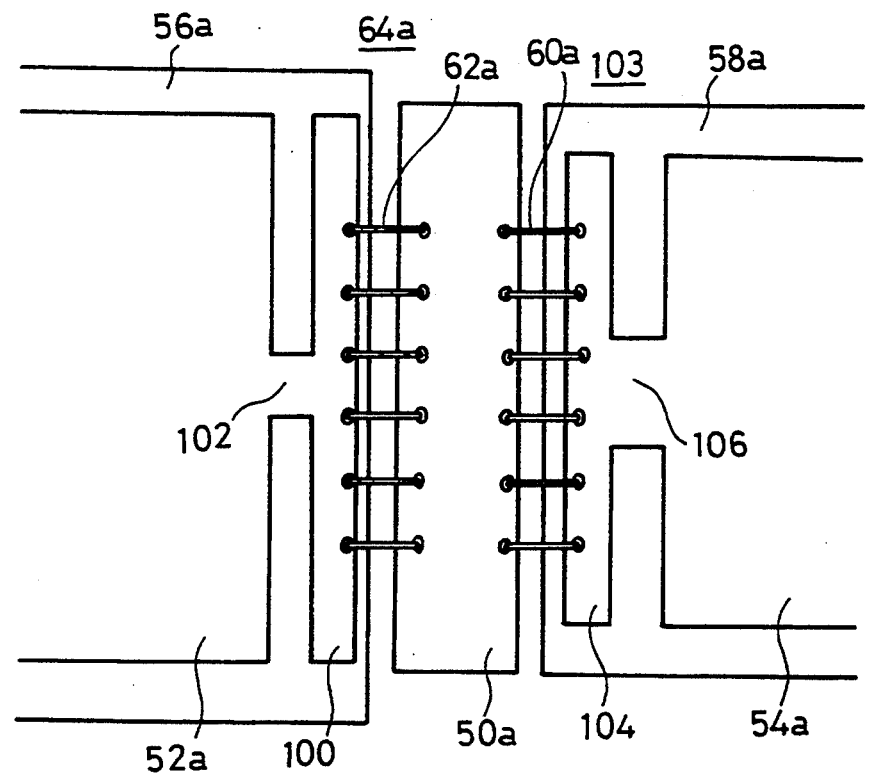
FIG. 8 is a plan view in the vicinity of an FET of a microwave amplifier according to a second embodiment of the present invention.

FIG. 8 shows a second embodiment. Those components similar to the ones used in the first embodiment are given the same reference numerals with "a" added at the end, and are not explained a second time. In this embodiment, a connecting section 64a for connecting an input-side matching circuit 52a and an FET 50a comprises microstrip lines 100 and 102. Microstrip line 100 has the same width as input-side matching circuit 52a. Microstrip line 102 connects microstrip line 100 with input-side matching circuit 52a and is narrower than microstrip line 100. The structure comprising microstrip lines 100 and 102 and input-side matching circuit 52a is equivalent to the structure comprising microstrip lines 76,78 and 74 shown in FIG. 6, and, hence, is equivalent to an arrangement in which a plurality of inductors are connected between input-side matching circuit 52a and the gate of FET 50a. The values of the inductors can be determined according to the aforementioned expressions (1) through (5), provided that a relative dielectric constant and thickness of substrate 54a and a wavelength reduction factor are known.

In this embodiment, a connecting section 103 is connected between the drain of FET 50a and output-side matching circuit 54a. The section 103 comprises a microstrip line 104 of the same width as output-side matching circuit 54a and a narrower microstrip line 106. Microstrip line 104 is connected by bonding wires 60a to the drain of FET 50a and also connected by microstrip line 106 to output-side matching circuit 54a. The width dimension of microstrip line 106 can be determined in the same way as microstrip line 102, after the inductance necessary to cancel the imaginary part of S22 of FET 50a is determined. Similar to connecting section 64 in the first embodiment, connection section 103 may comprises a plurality of microstrip lines having the same width as output-side matching circuit and narrower microstrip lines. In this second embodiment, the number of microstrip lines of connection section 64a is only two which is less than the number of microstrip lines in the first embodiment, and, therefore, the length of dielectric substrate 56a can be shorter than that of dielectric substrate 56 in the first embodiment.

Figure 9:
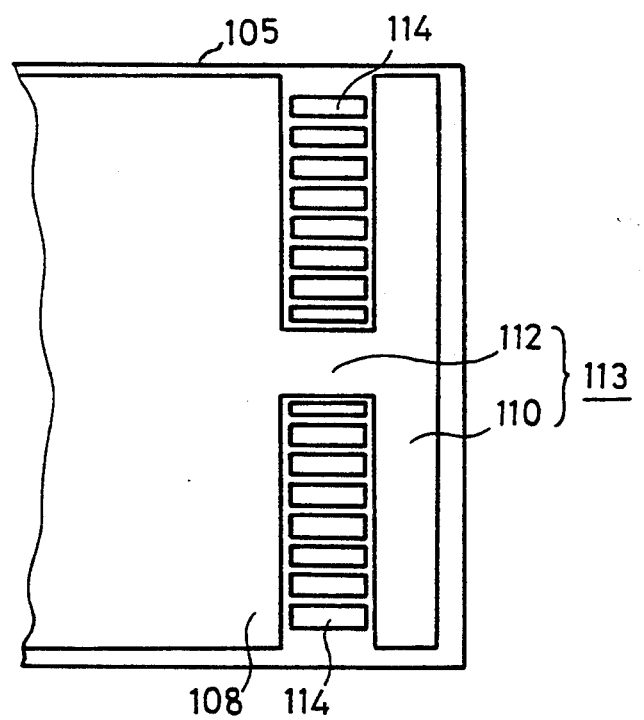
FIG. 9 is a plan view in the vicinity of an input-side matching circuit of a microwave amplifier according to a third embodiment of the present invention.

FIG. 9 shows a third embodiment of the present invention. This embodiment also includes a connecting section 113 which comprises microstrip lines 110 and 112 continuous to and integral with an input-side matching circuit 108 disposed on a dielectric substrate 105. Microstrip line 110 has the same width a s input-side matching circuit 108, whereas microstrip line 112 has a narrower width than microstrip line 110. The width of microstrip line 112 can be determined in the same manner as employed in the first and second embodiments. A plurality of metallic islands 114 are juxtaposed, as shown, on opposite sides of microstrip line 112. The length of metallic islands 114 is slightly less than that of microstrip line 112. One or more of metallic islands nearer to microstrip line 112 may be connected by bonding wires (not shown) to microstrip line 110 and input-side matching circuit 108 when the S parameter S11 of an FET (not shown) deviates from a desired value or when the inductance provided by microstrip lines 112 and 110 deviates from a desired value. This is effectively equal to using a wider microstripline as microstrip line 112. Thus, the step of connecting a metallic island is repeated until an inductance necessary for cancelling the imaginary part of the S parameter S11 or a desired inductance is provided.

Similar metallic islands may be employed for the connecting section of the output-side matching circuit of the second embodiment, or the connection sect ion of the input-side matching circuit of the first embodiment.

Japanese Unexamined Patent Publication No. SHO 64-49401 discloses two pairs of stubs extending perpendicular to the respective ends of a phase adjustment transmission line which has one end connected by bonding wires to the gate of a FET and the other end connected to another transmission line. The phase adjustment transmission line is used to modify S11 or S22 of the FET to a predetermined value, and the stubs are used to further modify the reflection factors to 0. Thus, the invention of this Japanese unexamined patent publication is different from the present invention which is aimed at cancelling the imaginary parts of S11 and S22 of a FET.

What is claimed is:

1. A microwave amplifier comprising:

a microwave amplifying device having an input and an output;

an input matching circuit connected to the input of said microwave amplifying device; and an output matching circuit connected to the output of said microwave amplifying device wherein each of said input and output matching circuits is a distributed constant circuit comprising microstrip lines disposed on a dielectric substrate and at least one of said input and output matching circuits includes a connecting section for connecting that matching circuit to said microwave amplifying device, said connecting section comprising a first microstrip line having a first width equal to that of the matching circuit to which said connecting section is connected and a second microstrip line continuous and integral with said first microstrip line and having a second width smaller than said first width.

2. The microwave amplifier according to claim 1 wherein said matching circuit including said connecting section is said input matching circuit.

3. The microwave amplifier according to claim 2 wherein said microwave amplifying device has a capacitive input impedance.

4. The microwave amplifier according to claim 1 wherein said second microstrip line is located between said first microstrip line and said matching circuit including said connecting section.

5. The microwave amplifier according to claim 4 wherein said matching circuit including said connecting section is said input matching circuit.

6. The microwave amplifier according to claim 5 wherein said microwave amplifying device has a capacitive input impedance.

7. The microwave amplifier according to claim 1 including a plurality of metallic islands arranged on at least one side of said second microstrip line juxtaposed in a direction extending away from said second microstrip line.

8. The microwave amplifier according to claim 7 wherein said metallic islands are disposed on two sides of said second microstrip line.

9. The microwave amplifier according to claim 8 wherein said metallic islands are slightly shorter than said second microstrip line.

10. The microwave amplifier according to claim 8 wherein said matching circuit including said connecting section is said input matching circuit.

11. The microwave amplifier according to claim 8 wherein said matching circuit including said connecting section is said input matching circuit and said microwave amplifying device has a capacitive input impedance.

12. The microwave amplifier according to claim 7 wherein said metallic islands are slightly shorter than said second microstrip line.

13. The microwave amplifier according to claim 7 wherein said matching circuit including said connecting section is said input matching circuit.

14. The microwave amplifier according to claim 7 wherein said matching circuit including said connecting section is said input matching circuit and said microwave amplifying device has a capacitive input impedance.

15. The microwave amplifier according to claim 1 wherein each of said first and second microstrip lines comprises at least two microstrip lines.

16. The microwave amplifier according to claim 15 wherein said at least two first microstrip lines alternate with said at least two second microstrip lines.

17. The microwave amplifier according to claim 16 wherein each of said microstrip lines has a different length.

18. The microwave amplifier according to claim 17 wherein said matching circuit including said connecting section is said input matching circuit.

19. The microwave amplifier according to claim 17 wherein said matching circuit including said connecting section is said input matching circuit and said microwave amplifying device has a capacitive input impedance.

20. The microwave amplifier according to claim 16 wherein said matching circuit including said connecting section is said input matching circuit.

21. The microwave amplifier according to claim 16 wherein said matching circuit including said connecting section is said input matching circuit and said microwave amplifying device has a capacitive input impedance.

22. The microwave amplifier according to claim 15 wherein said matching circuit including said connecting section is said input matching circuit.

23. The microwave amplifier according to claim 15 wherein said matching circuit including said connecting section is said input matching circuit and said microwave amplifying device has a capacitive input impedance.

* * * * *